US012644931B2

(12) United States Patent
Kim et al.

(10) Patent No.: US 12,644,931 B2
(45) Date of Patent: Jun. 2, 2026

(54) BATTERY RISK EVALUATION DEVICE AND OPERATING METHOD THEREOF

(71) Applicant: SAMSUNG ELECTRONICS CO., LTD., Suwon-si (KR)

(72) Inventors: Kyutae Kim, Suwon-si (KR); SungHyun Yoon, Suwon-si (KR); Jonghoon Kim, Daejeon (KR); Sanguk Kwon, Daejeon (KR); Jeongho Ahn, Daejeon (KR)

(73) Assignees: SAMSUNG ELECTRONICS CO., LTD., Suwon-si (KR); The Industry & Academic Cooperation in Chungnam National University (IAC), Daejeon (KR)

( * ) Notice: Subject to any disclaimer, the term of this patent is extended or adjusted under 35 U.S.C. 154(b) by 369 days.

(21) Appl. No.: 18/199,571

(22) Filed: May 19, 2023

(65) Prior Publication Data

US 2024/0036118 A1 Feb. 1, 2024

(30) Foreign Application Priority Data

Jul. 29, 2022 (KR) ........................ 10-2022-0095069

(51) Int. Cl.
*G01R 31/392* (2019.01)
*G01R 31/36* (2020.01)
(Continued)

(52) U.S. Cl.
CPC ....... *G01R 31/392* (2019.01); *G01R 31/3648* (2013.01); *G01R 31/367* (2019.01); *G01R 31/374* (2019.01)

(58) Field of Classification Search
None
See application file for complete search history.

(56) References Cited

U.S. PATENT DOCUMENTS 9,310,441 B2 4/2016 Jo
10,983,166 B2 4/2021 Hellgren et al.
(Continued)

FOREIGN PATENT DOCUMENTS

JP 2005-114401 A 4/2005
JP 2011-106952 A 6/2011
(Continued)

OTHER PUBLICATIONS

Taesuk Mun et al., "RLS-based Real-time inconsistency monitoring and inter-cell inconsistency evaluation using Z-score", Proceedings of Fall Conference of Power Electronics Society, Nov. 26, 2021, pp. 68-70 (6 total pages).

*Primary Examiner* — Shelby A Turner
*Assistant Examiner* — Cynthia L Davis
(74) *Attorney, Agent, or Firm* — Sughrue Mion, PLLC

(57) ABSTRACT

A battery risk assessment device for a battery module including a plurality of battery cells, including a data measurement unit configured to generate sensing data corresponding to the battery module; a deviation calculator configured to: calculate diffusion resistance data of the plurality of battery cells by using a Thevenin equivalent circuit of the battery module, and calculate deviation information based on the sensing data and the diffusion resistance data, wherein the deviation information indicates at least one from among a voltage deviation of the plurality of battery cells, a temperature deviation of the plurality of battery cells, and a diffusion resistance deviation of the plurality of battery cells; and a risk assessment unit configured to determine a battery risk state based on the deviation information.

20 Claims, 9 Drawing Sheets

10

(51) Int. Cl.
  *G01R 31/367* (2019.01)
  *G01R 31/374* (2019.01)

(56) References Cited

U.S. PATENT DOCUMENTS

| | | | |
|---|---|---|---|
| 11,105,861 B2 | 8/2021 | Seo | |
| 11,125,823 B2 | 9/2021 | Ahn | |
| 11,175,347 B2 | 11/2021 | Kim et al. | |
| 11,193,985 B2 | 12/2021 | Bae et al. | |
| 2015/0165919 A1* | 6/2015 | Hughes | H01M 10/486 |
| | | | 320/109 |
| 2018/0131197 A1* | 5/2018 | McEwan | H02J 7/0048 |
| 2020/0278398 A1 | 9/2020 | Isa et al. | |
| 2021/0190876 A1 | 6/2021 | Takechi et al. | |
| 2021/0199724 A1 | 7/2021 | Kim | |
| 2022/0140617 A1* | 5/2022 | Wang | G01R 31/396 |
| | | | 320/134 |

| | | | |
|---|---|---|---|
| 2022/0155381 A1 | 5/2022 | Jo et al. | |
| 2023/0288490 A1* | 9/2023 | Du | B60L 3/0046 |

FOREIGN PATENT DOCUMENTS

| | | |
|---|---|---|
| JP | 2017-40574 A | 2/2017 |
| JP | 2020-8349 A | 1/2020 |
| KR | 10-2014-0053590 A | 5/2014 |
| KR | 10-1711258 B1 | 2/2017 |
| KR | 10-1725514 B1 | 4/2017 |
| KR | 10-2018-0126842 A | 11/2018 |
| KR | 10-2019-0095754 A | 8/2019 |
| KR | 10-2020-0102891 A | 9/2020 |
| KR | 10-2221860 B1 | 3/2021 |
| KR | 10-2021-0080650 A | 7/2021 |
| KR | 10-2021-0155980 A | 12/2021 |
| KR | 10-2021-0158123 A | 12/2021 |
| KR | 10-2022-0013167 A | 2/2022 |

* cited by examiner

| Data_Var | R | Range |
|---|---|---|
| Var_V | 0 | 0~0.1[V] |
| | 1 | 0.1~∞[V] |
| Var_T | 0 | 0~5[℃] |
| | 1 | 5~8[℃] |
| | 2 | 8~∞[℃] |
| Var_R | 0 | 0~142[%] |
| | 1 | 142~165[%] |
| | 2 | 165~273[%] |
| | 3 | 273~455[%] |

BATTERY RISK EVALUATION DEVICE AND OPERATING METHOD THEREOF

CROSS-REFERENCE TO RELATED APPLICATIONS

This application claims priority under 35 U.S.C. § 119 to Korean Patent Application No. 10-2022-0095069 filed on Jul. 29, 2022, in the Korean Intellectual Property Office, the disclosure of which is incorporated by reference herein in its entirety.

BACKGROUND

1. Field

The present disclosure relates to a battery risk assessment device and an operating method thereof, and more particularly, to a device for determining a risk state of a battery module including a plurality of battery cells.

2. Description of Related Art

In energy storage systems and an electric vehicles that use lithium batteries as a main energy source, accidents such as fire accidents having unknown causes may occur. A battery defect may be identified as the cause of the fire, which may lead to recalls of some electric vehicles. In some instances, a sharp voltage drop and temperature increase that are presumed to be caused by a short circuit of the defective battery have been observed, and an abnormal voltage deviation has been observed between cells of battens in which fire has occurred. Accordingly, there is a need for a battery management system (BMS) that manages the battery through voltage, current, and temperature information for efficient and stable use of the battery.

Electrical circuit separation may be performed with respect to the damaged battery by detecting sharp or sudden changes in at least one of voltage, current, and temperature signals of the battery. However, when the sharp change in the signal occurs, the inside of the battery may be severely damaged already; in this case, even though the electrical circuit is disconnected, it may still be possible for a fire to occur in the battery. Therefore, there is a need to cope with the a battery fire in advance by detecting the signs of fire in the battery before serious damage occurs in the battery.

SUMMARY

Provided is a device capable of assessing a battery risk by monitoring a battery in real time.

Also provided is a method capable of assessing a battery risk by monitoring a battery in real time.

In accordance with an aspect of the disclosure, a battery risk assessment device for a battery module including a plurality of battery cells includes a data measurement unit configured to generate sensing data corresponding to the battery module, wherein the sensing data include cell voltage data comprising voltage information about the plurality of battery cells, cell temperature data comprising temperature information about the plurality of battery cells, module voltage data comprising information about a voltage output from the battery module, and module current data comprising information about a current output from the battery module; a deviation calculator configured to: calculate diffusion resistance data of the plurality of battery cells by using a Thevenin equivalent circuit of the battery module, and calculate deviation information based on the sensing data and the diffusion resistance data, wherein the deviation information indicates at least one from among a voltage deviation of the plurality of battery cells, a temperature deviation of the plurality of battery cells, and a diffusion resistance deviation of the plurality of battery cells; and a risk assessment unit configured to determine a battery risk state based on the deviation information.

In accordance with an aspect of the disclosure, a battery risk assessment method for a battery module including a plurality of battery cells includes generating sensing data corresponding to the battery module, wherein the sensing data include cell voltage data comprising voltage information about the plurality of battery cells, cell temperature data comprising temperature information about the plurality of battery cells, module voltage data comprising information about a voltage output from the battery module, and module current data comprising information about a current output from the battery module; calculating diffusion resistance data of the plurality of battery cells by using a Thevenin equivalent circuit of the battery module; calculating deviation information based on the sensing data and the diffusion resistance data, wherein the deviation information indicates at least one from among a voltage deviation of the plurality of battery cells, a temperature deviation of the plurality of battery cells, and a diffusion resistance deviation of the plurality of battery cells; and determining a battery risk state based on the deviation information.

In accordance with an aspect of the disclosure, a terminal includes a battery risk assessment device corresponding to a battery module including a plurality of battery cells, wherein the battery risk assessment device includes: a data measurement unit configured to measure the battery module at regular time intervals and to generate sensing data, wherein the sensing data include cell voltage data comprising voltage information about the plurality of battery cells, cell temperature data comprising temperature information about the plurality of battery cells, module voltage data comprising information about a voltage output from the battery module, and module current data comprising information about a current output from the battery module; a deviation calculator configured to: calculate diffusion resistance data of the plurality of battery cells by using a Thevenin equivalent circuit of the battery module, and calculate deviation information based on the sensing data and the diffusion resistance data, wherein the deviation information indicates at least one from among a voltage deviation of the plurality of battery cells, a temperature deviation of the plurality of battery cells, and a diffusion resistance deviation of the plurality of battery cells; and a risk assessment unit configured to determine a battery risk state based on the deviation information.

BRIEF DESCRIPTION OF DRAWINGS

The above and other aspects, features, and advantages of certain embodiments of the present disclosure will be more apparent by from the following description taken in conjunction with the accompanying drawings, in which:

FIG. 3 is a diagram for describing a configuration and an operation of a diffusion resistance deviation calculator of FIG. 2, according to an embodiment of the present disclosure.

FIG. 9 is a diagram illustrating an example of a risk score table for assigning a risk score to deviation information, according to an embodiment of the present disclosure.

DETAILED DESCRIPTION

Figure 1:
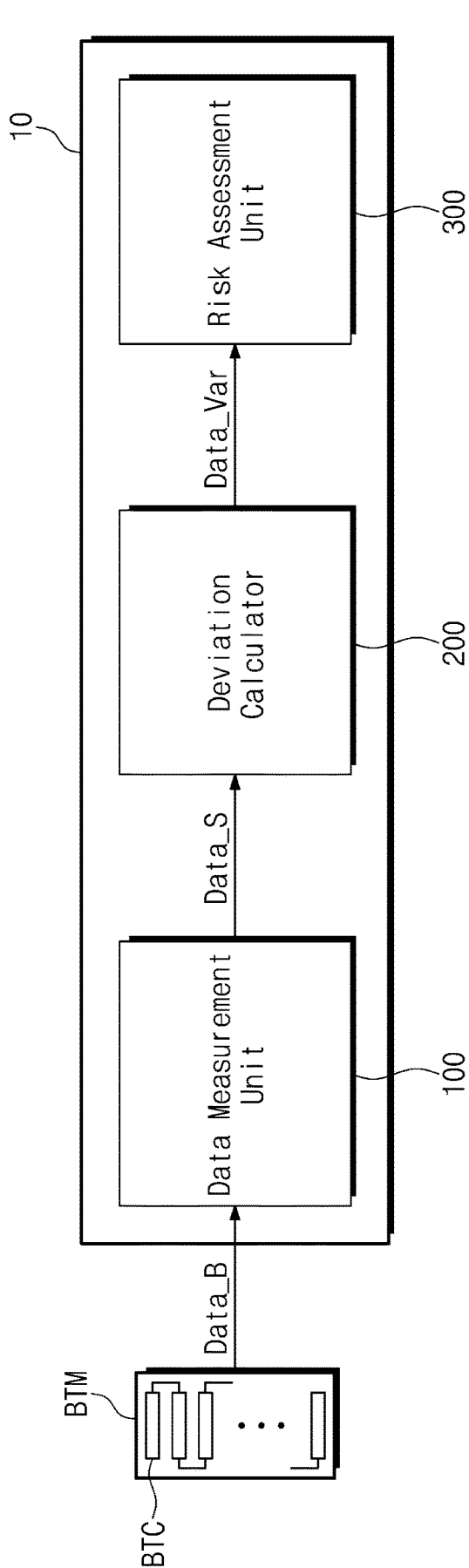
FIG. 1 is a block diagram illustrating a battery risk assessment device according to an embodiment of the present disclosure.

Below, embodiments of the present disclosure are described in detail with reference to the accompanying drawings.

As is traditional in the field, embodiments may be described and illustrated in terms of blocks which carry out a described function or functions. These blocks, as shown in the drawings, which may be referred to herein as "units" or "modules" or the like, or by names such as device, generator, calculator, corrector, estimator, rectifier, converter, chopper, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

FIG. 1 is a block diagram illustrating a battery risk assessment device according to an embodiment of the present disclosure. Referring to FIG. 1, a battery risk assessment device 10 may include a data measurement unit 100, a deviation calculator 200, and a risk assessment unit 300.

The data measurement unit 100 may be configured to measure information Data_B about a battery targeted for risk assessment, and to generate sensing data Data_S. The data measurement unit 100 may measure the battery at regular time intervals. Accordingly, the sensing data Data_S may be generated at regular time intervals.

The battery may include a battery module BTM. The battery module BTM may include a plurality of battery cells BTC connected in series.

As an example, the sensing data Data_S generated by the data measurement unit 100 may include module current data, which may be current information about the battery module BTM, and module voltage data, which may be voltage information about the battery module BTM. Also, the sensing data Data_S may include cell voltage data, which may be individual voltage information about the plurality of battery cells BTC, and cell temperature data, which may be individual temperature information about the plurality of battery cells BTC.

The module voltage data may be collected by measuring an output voltage of the battery module BTM. The module current data may be collected by measuring a current output from the battery module BTM. The cell voltage data may be collected by measuring an output voltage of each battery cell BTC. The cell temperature data may be collected by measuring a surface temperature of each battery cell BTC.

The data measurement unit 100 may be configured to transfer the sensing data Data_S collected from the battery to the deviation calculator 200. The data measurement unit 100 may be configured to measure information about the battery, an example of which is described in detail with reference to FIG. 2.

The deviation calculator 200 may be configured to calculate deviation information Data_Var about deviation between battery cells based on the sensing data Data_S received from the data measurement unit 100. The deviation information Data_Var may include a temperature deviation, a voltage deviation, and a diffusion resistance deviation of battery cells.

As an example, the temperature deviation may be calculated as a difference between a maximum temperature value and a minimum temperature value among the temperature data of the battery cells. As another example, the voltage deviation may be calculated as a difference between a maximum voltage value and a minimum voltage value among the voltage data of the battery cells. As yet another example, the diffusion resistance deviation may be calculated based on the diffusion resistance data of the battery cells as a ratio between an average resistance value and the maximum resistance value.

The diffusion resistance data of the battery cells may be calculated based on the electrical equivalent circuit model (EECM) of the battery. In an embodiment, the electrical equivalent circuit model of the battery may include a Thevenin equivalent circuit model.

The diffusion resistance data of the battery cells may be calculated based on the Thevenin equivalent circuit by using an extended Kalman filter (EKF), a state of charge-open circuit voltage (SOC-OCV) table, and a recursive least square (RLS). An example of how to calculate the diffusion resistance deviation based on the Thevenin equivalent circuit of the battery is described in detail with reference to FIGS. 6 and 7.

The deviation calculator 200 may transfer the deviation information Data_Var of the battery cells to the risk assessment unit 300.

The risk assessment unit 300 may be configured to receive the deviation information Data_Var, and to calculate a risk score. The risk assessment unit 300 may determine a risk for each of, or at least one of, the voltage deviation, the temperature deviation, and the diffusion resistance deviation.

The risk assessment unit 300 may include a risk score table. The risk assessment unit 300 may be configured to determine the risk based on the deviation information Data_Var and the risk score table. The risk assessment unit 300 may generate the risk score by summing the risks to the deviation information Data_Var.

The risk assessment unit 300 may be configured to determine a battery risk state based on the risk score. As an example, the battery risk state may include a management-targeted state, a check-required state, and an immediate stop state.

In embodiments, the battery risk state determined by the risk assessment unit 300 may be displayed to the user through a display associated with the battery, for example a display included in a terminal which includes the battery. As an example, when the battery risk state is the immediate stop state, a battery management system included in the terminal may stop the operation of the terminal.

Figure 2:
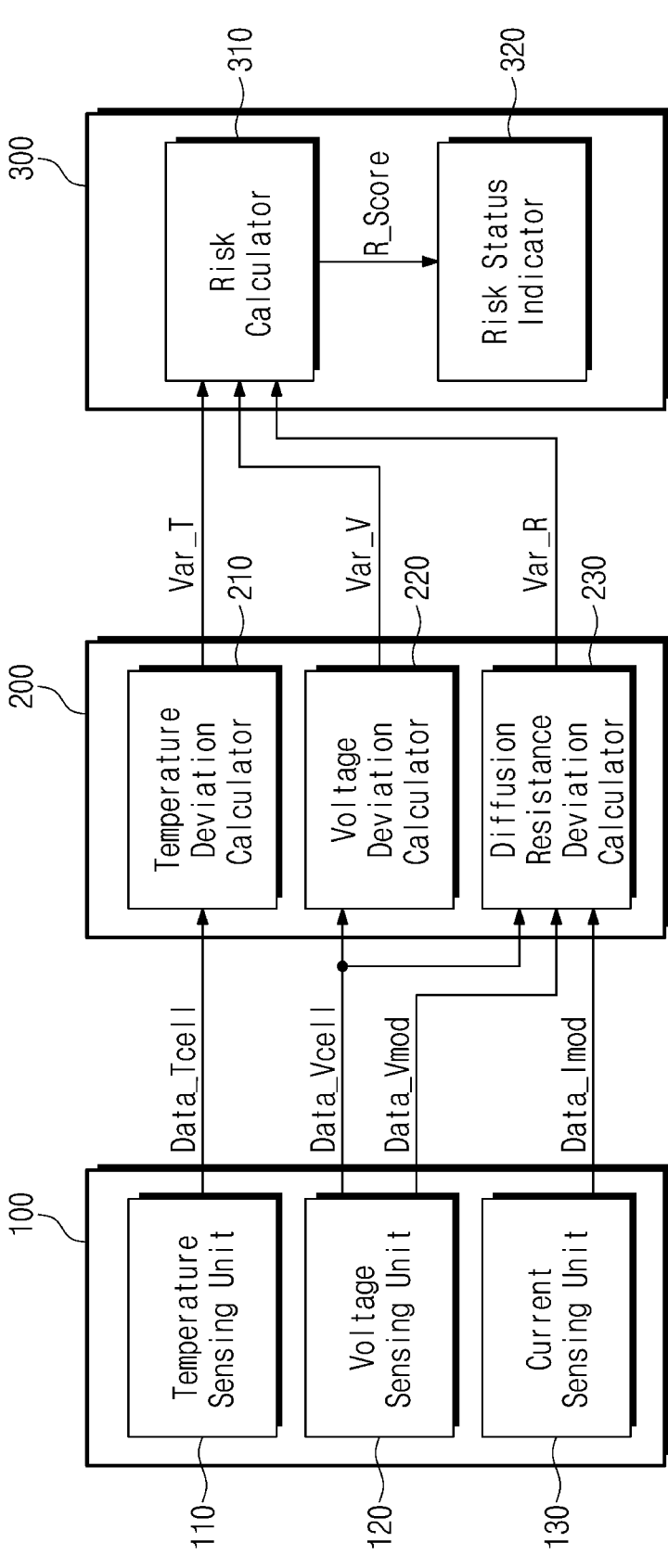
FIG. 2 is a diagram illustrating a configuration of a battery risk assessment device of FIG. 1, according to an embodiment of the present disclosure.

FIG. 2 is a diagram illustrating a configuration of a battery risk assessment device of FIG. 1 in detail. Below, redundant description of the configuration, function, characteristic, and operation given with reference to FIG. 1 may be omitted in describing the battery risk assessment device 10 disclosed in FIG. 2.

Referring to FIG. 2, the data measurement unit 100 included in the battery risk assessment device 10 may include a temperature sensing unit 110, a voltage sensing unit 120, and a current sensing unit 130.

The current sensing unit 130 may measure the amount of output current of a battery module targeted for risk assessment and may generate and output module current data Data_Imod including information about the measured current value. For example, the current sensing unit 130 may measure the amount of output current accumulated from a time point where the battery module is fully charged. The module current data Data_Imod output from the current sensing unit 130 may be provided to a diffusion resistance deviation calculator 230 included in the deviation calculator 200.

The voltage sensing unit 120 may measure the output voltage of the battery module targeted for risk assessment and may generate and output module voltage data Data_Vmod including information about the measured voltage value. The module voltage data Data_Vmod output from the voltage sensing unit 120 may be provided to the diffusion resistance deviation calculator 230 included in the deviation calculator 200.

The voltage sensing unit 120 may measure the voltage of each of a plurality of battery cells included in the battery module and may generate and output cell voltage data Data_Vcell including information about the measured voltage value. The cell voltage data Data_Vcell output from the voltage sensing unit 120 may be provided to a voltage deviation calculator 220.

The temperature sensing unit 110 may measure the surface temperature of battery cells targeted for risk assessment and may output cell temperature data Data_Tcell including information about the measured temperature value. The cell temperature data Data_Tcell output from the temperature sensing unit 110 may be provided to a temperature deviation calculator 210 included in the deviation calculator 200.

Referring again to FIG. 2, the deviation calculator 200 included in the battery risk assessment device 10 may include the temperature deviation calculator 210, the voltage deviation calculator 220, and the diffusion resistance deviation calculator 230.

The temperature deviation calculator 210 may be configured to receive the cell temperature data Data_Tcell of the battery cells, and to calculate a temperature deviation Var_T of battery cells. As an example, the temperature deviation calculator 210 may calculate a difference between a maximum temperature and a minimum temperature of the cell temperature data Data_Tcell as the temperature deviation Var_T. In embodiments, the temperature deviation Var_T may be calculated based on the difference between the maximum temperature and the minimum temperature of the cell temperature data Data_Tcell of the battery cells included in the battery module.

The voltage deviation calculator 220 may be configured to receive the cell voltage data Data_Vcell of the battery cells, and to calculate a voltage deviation Var_V of the battery cells. As an example, the voltage deviation calculator 220 may calculate a difference between a maximum voltage and a minimum voltage of the cell voltage data Data_Vcell as the voltage deviation Var_V. In embodiments, the voltage deviation Var_V may be calculated based on the difference between the maximum voltage and the minimum voltage of the cell voltage data Data_Vcell of the battery cells included in the battery module.

The diffusion resistance deviation calculator 230 may be configured to receive the cell voltage data Data_Vcell of the battery cells included in the battery module, the module voltage data Data_Vmod of the battery module, and the module current data Data_Imod of the battery module, and to calculate a diffusion resistance deviation Var_R of the battery cells.

The diffusion resistance deviation calculator 230 may calculate diffusion resistance data of each battery cell based on the Thevenin equivalent circuit of the battery cell by using the extended Kalman filter, the SOC-OCV table, and the recursive least square. An example of the diffusion resistance deviation calculator 230 is described with reference to FIGS. 3 to 5.

Figure 3:
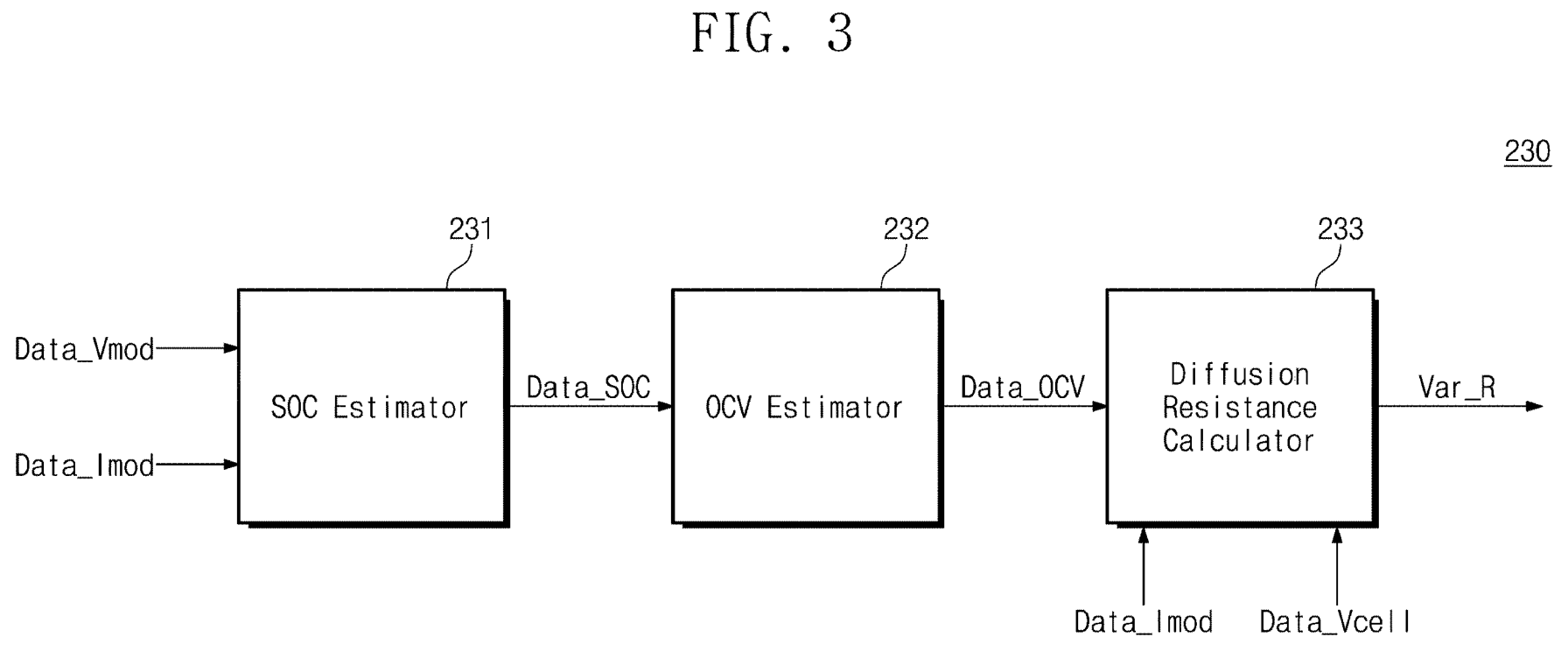
Figure 4:
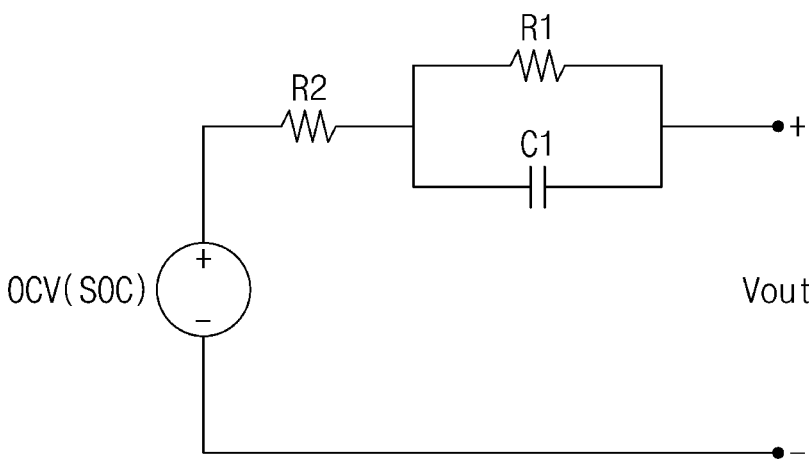
FIG. 4 is a diagram illustrating a Thevenin equivalent circuit of a battery module to describe an operation of a diffusion resistance deviation calculator of FIG. 2, according to an embodiment of the present disclosure.
Figure 5:
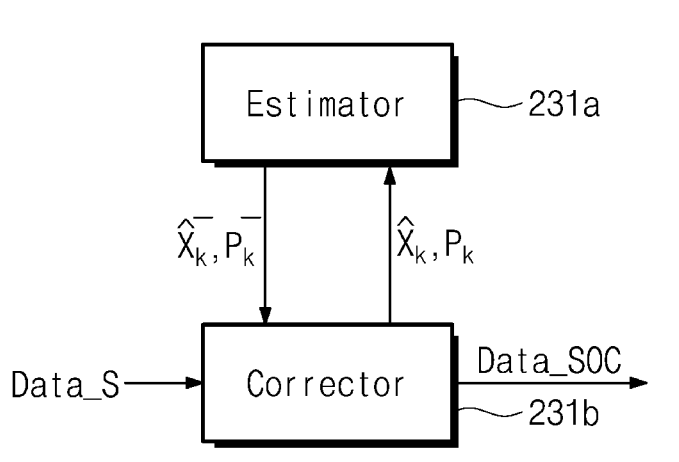
FIG. 5 is a diagram illustrating an SOC estimator of FIG. 3, according to an embodiment of the present disclosure.

FIG. 3 is a diagram for describing a configuration and an operation of a diffusion resistance deviation calculator of FIG. 2 in detail. FIG. 4 is a diagram illustrating a Thevenin equivalent circuit of a battery cell to describe an operation of a diffusion resistance deviation calculator of FIG. 2. FIG. 5 is a diagram illustrating an SOC estimator of FIG. 3 in detail.

Referring to FIG. 3, the diffusion resistance deviation calculator 230 may include an SOC estimator 231, an open circuit voltage (OCV) estimator 232, and a diffusion resistance calculator 233.

The SOC estimator 231 may receive the sensing data Data_S from the data measurement unit 100. The SOC estimator 231 may determine a state of charge (SOC) of a battery based on the cell voltage data Data_Vcell and the module current data Data_Imod of the received sensing data Data_S.

Referring to FIG. 4, the battery risk assessment device 10 according to an embodiment of the present disclosure may estimate the SOC based on the Thevenin equivalent circuit of the battery cell. In embodiments, the SOC estimator 231 may receive the cell voltage data Data_Vcell and the module current data Data_Imod from the data measurement unit 100 and may generate SOC data Data_SOC based on the Thevenin equivalent circuit of a battery module by using the extended Kalman filter. Below, an operation of the SOC estimator 231 is described in detail.

Referring to FIG. 5, the SOC estimator 231 may include an estimator 231a and a corrector 231b.

The estimator 231a may calculate a predicted SOC value and a predicted error covariance. The calculation of the predicted SOC value, which is performed by the estimator 231a, may be performed based on Equation 1 below. In Equation 1, $$\hat{x}_k^-$$

represents a predicted SOC value of a k-th time point, and $\hat{x}_{k-1}$ represents an SOC value of a (k−1)th time point. $C_1$ represents a value of a capacitor in the Thevenin equivalent circuit of FIG. 4, and $R_1$ represents a first resistance value when the battery is expressed by the Thevenin equivalent circuit. Q represents a process noise covariance, $Q_{max}$ represents a maximum SOC process noise covariance, and $I_k$ represents represents a current value measured at the k-th time point, which may be included in the sensing data Data_S.

$$\hat{x}_k^- = \begin{bmatrix} 1 & 0 \\ 0 & 1 - \exp\left(-\dfrac{\delta t}{C_1 R_1}\right) \end{bmatrix} \hat{x}_{k-1} + \begin{bmatrix} -\dfrac{\delta t}{Q_{max}} \\ R_1\left(1 - \exp\left(-\dfrac{\delta t}{C_1 R_1}\right)\right) \end{bmatrix} I_{k-1}$$ [Equation 1]

The calculation of the predicted error covariance, which is performed by the estimator 231a, may be performed based on Equation 2 and Equation 3 below. As shown in Equation 2, $$P_k^-$$

represents a predicted error covariance, $P_{k-1}$ represents an error covariance at the (k−1)-th time point, and A may be determined using Equation 3.

$$P_k^- = A P_{k-1} A^T + Q$$ [Equation 2]

$$A = \begin{bmatrix} 1 & 0 \\ 0 & 1 - \exp\left(-\dfrac{\delta t}{C_1 R_1}\right) \end{bmatrix}$$ [Equation 3]

The estimator 231a may transfer the predicted SOC value of the k-th time point and the predicted error covariance of the k-th time point to the corrector 231b.

The corrector 231b may receive the sensing data Data_S from the data measurement unit 100. The corrector 231b may receive the cell voltage data Data_Vcell and the module current data Data_Imod of the sensing data Data_S and may calculate a Kalman gain, an SOC value, and an error covariance. The calculation of the Kalman gain, which is performed by the corrector 231b, may be performed based on Equation 4, Equation 5, and Equation 6 below. As shown in Equation 4, $K_k$ represents a Kalman gain, R represents a measurement noise, H may be determined using Equation 5, and $H^T$ represents a transverse of H.

$$K_k = P_k^- H^T \left(H P_k^- H^T + R\right)^{-1}$$ [Equation 4]

$$H = \begin{bmatrix} \dfrac{\delta OCV}{\delta SOC} & -1 \end{bmatrix}$$ [Equation 5]

$$OCV = 2.58 SOC + 3.81 e^{-0.84 SOC} - 0.3 e^{-8.3 SOC}$$ [Equation 6]

The calculation of the SOC value, which is performed by the corrector 231b, may be performed based on Equation 7 below. As shown in Equation 7, $\hat{x}_k$ an SOC value of the k-th time point, and $z_k$ represents the sensing data Data_S of the k-th time point.

$$\hat{x}_k = \hat{x}_k^- + K_k(z_k - h(\hat{x}_k^-))$$ [Equation 7]

The calculation of the error covariance, which is performed by the corrector 231b, may be performed based on Equation 8 below. In Equation 8, $P_k$ represents an error covariance, and H may represent the same variable shown in Equation 4.

$$P_k = P_k^- - K_k H P_k^-$$ [Equation 8]

The SOC data Data_SOC, which may include information of the SOC value calculated by the corrector 231b, may be transferred to the OCV estimator 232. The SOC value and the error covariance calculated by the corrector 231b may again be transferred to the estimator 231a. Also, the estimator 231a may update the variables A and Q of Equation 2 based on the SOC value and the error covariance thus transferred. Afterwards, the estimator 231a may repeatedly perform the calculations according to Equation 4 through Equation 8, based on the updated A and Q.

The SOC estimator 231 may calculate the SOC value more accurately, by adjusting a parameter of the extended Kalman filter based on the SOC value and the error covariance calculated by the corrector 231b.

Returning to FIG. 3, the OCV estimator 232 may receive the SOC data Data_SOC from the SOC estimator 231 and may output OCV data of each battery cell based on the SOC data Data_SOC.

An OCV may be defined as an open voltage of a battery that is uniquely determined from the state of charge SOC of the battery. That is, the OCV may be determined in advance depending on the SOC data Data_SOC.

The OCV estimator 232 may in advance store an SOC-OCV table defining the correlation between the state of charge and the open voltage of the battery. The OCV estimator 232 may be configured to read an OCV corresponding to the SOC data Data_SOC by using the SOC-OCV table, so as to be output as OCV data Data_OCV.

The diffusion resistance calculator 233 may receive the cell voltage data Data_Vcell and the module current data Data_Imod from the data measurement unit 100 and may receive the OCV data Data_OCV from the OCV estimator 232. The diffusion resistance calculator 233 may be configured to calculate diffusion resistance data of each battery cell through the recursive least square based on the received data. An example of a configuration and an operation of the diffusion resistance calculator 233 according to an embodiment is described in detail with reference to FIGS. 6 and 7.

Figure 6:
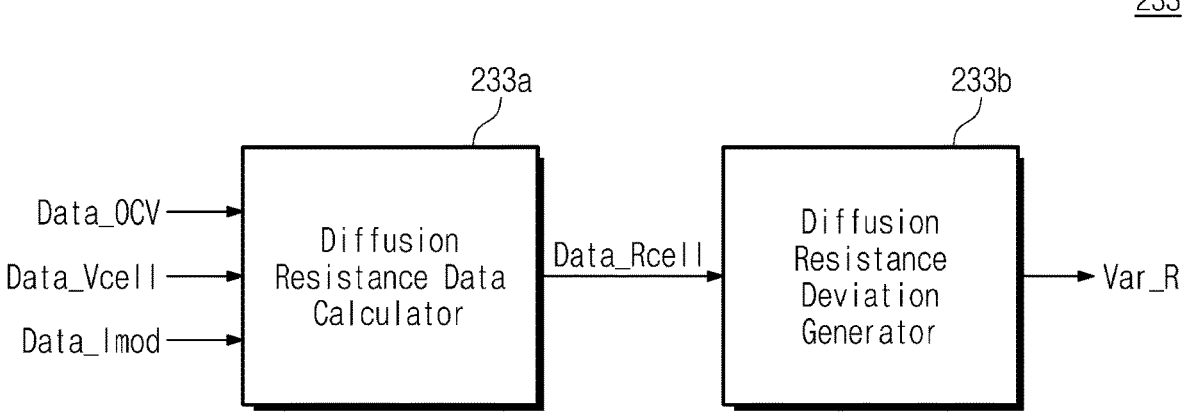
FIG. 6 is a diagram illustrating an example of a diffusion resistance calculator of FIG. 3, according to an embodiment of the present disclosure.
Figure 7:
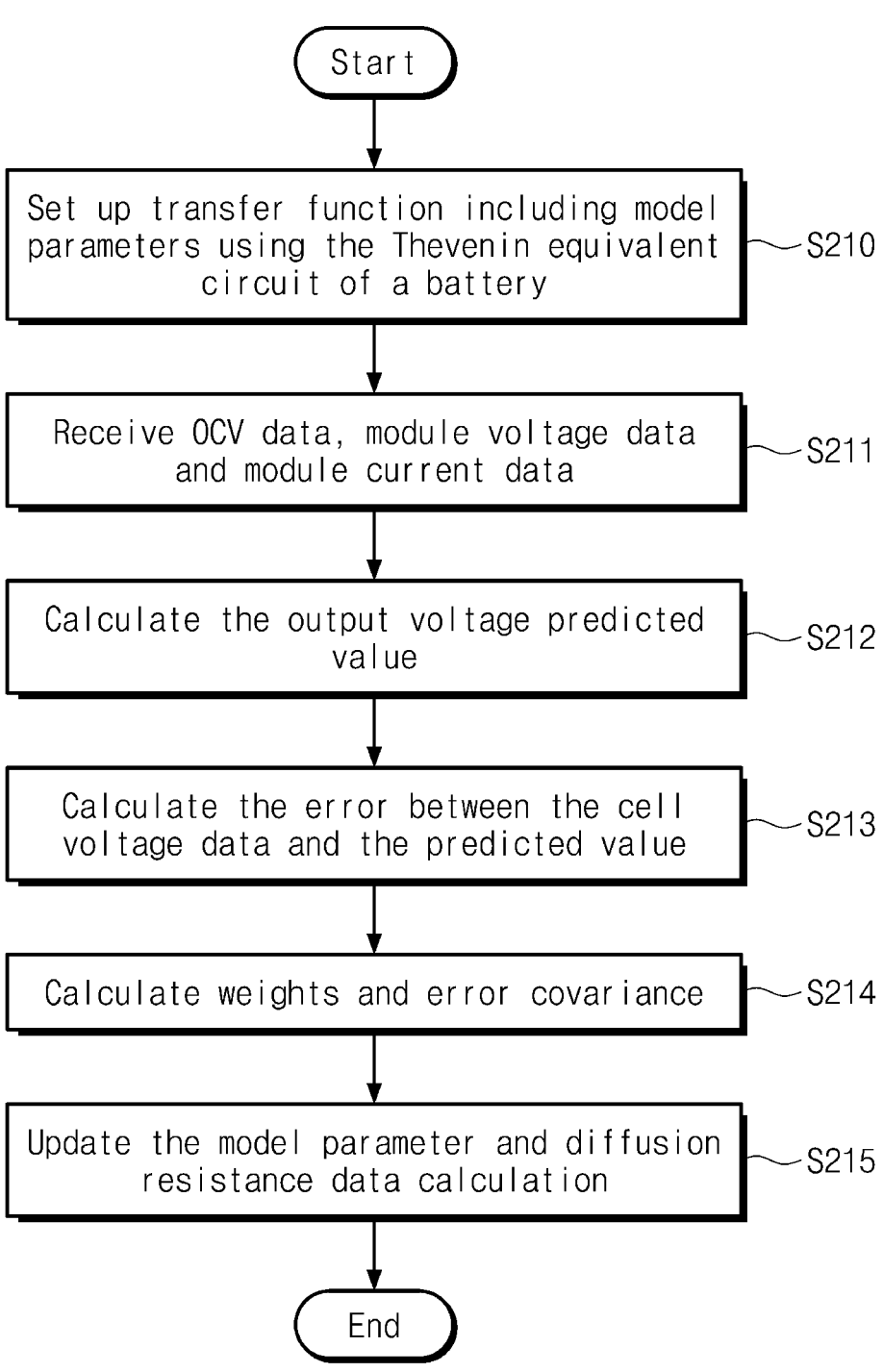
FIG. 7 is a flowchart for describing an operation of a diffusion resistance data calculator of FIG. 6, according to an embodiment of the present disclosure.

FIG. 6 is a diagram illustrating an example of a diffusion resistance calculator of FIG. 3. FIG. 7 is a flowchart for describing an operation of a diffusion resistance data calculator of FIG. 6.

Referring to FIG. 6, the diffusion resistance calculator 233 may include a diffusion resistance data calculator 233a and a diffusion resistance deviation generator 233b.

The diffusion resistance data calculator 233a may receive the cell voltage data Data_Vcell and the module current data Data_Imod from the data measurement unit 100 and may receive the OCV data Data_OCV from the OCV estimator 232. The diffusion resistance data calculator 233a may be configured to calculate diffusion resistance data of battery cells through the recursive least square based on the Thevenin equivalent circuit of the battery cell. An example of an operation of the diffusion resistance data calculator 233a is described with reference to FIG. 7.

Referring to FIG. 7, the diffusion resistance data calculator 233a may set up a transfer function including a model parameter through the Thevenin equivalent circuit of FIG. 3.

In an embodiment, the transfer function in the Thevenin equivalent circuit may be determined according to Equation 9, Equation 10, Equation 11, Equation 12, Equation 13, and Equation 14 below.

$$V_{qk} = -a_1 V_{qk-1} + b_0 I_k - b_1 I_{k-1} = \qquad \text{(Equation 9)}$$

$$[V_{qk-1}, I_k, I_{k-1}][-a_1, b_0, b_1]^T = \varphi_k \theta_k^T$$

$$a_1 = \frac{T_s}{C_{diff} R_{diff}} \qquad \text{(Equation 10)}$$

$$b_0 = R_i \qquad \text{(Equation 11)}$$

$$b_1 = -R_i + T_s/C_{diff} + (T_s R_i)/(C_{diff} R_i) \qquad \text{(Equation 12)}$$

$$\varphi_k = [V_{qk-1}, I_k, I_{k-1}] \qquad \text{(Equation 13)}$$

$$\theta_k = [-a_1, b_0, b_1] \qquad \text{(Equation 14)}$$

In Equation 9 through Equation 14, $V_{qk}$ represents the over potential value at a k-th time point, $I_k$ represents the module current data Data_Imod at the k-th time point, $V_{qk-1}$ represents the over potential value at a (k−1)-th time point, and $I_{k-1}$ represents the module current data Data_Imod at the (k−1)-th time point. The k-th time point may refer to a time point immediately after the (k−1)-th time point. Each of $a_1$ and $b_1$ may include information about diffusion resistance data $R_{diff}$ as a model parameter. Further, in Equation 9, $\varphi_k$ may be determined according to Equation 13, and $\theta_k$ may be determined according to Equation 14.

The over potential value of the (k−1)-th time point in Equation 6 may be calculated by Equation 7 below.

$$V_{qk-1} = V_{tk-1} - OCV \qquad \text{(Equation 15)}$$

In Equation 15, $V_{tk-1}$ represents a value of the cell voltage data Data_Vcell measured at the (k−1)-th time point, and OCV represents a value of the OCV data Data_OCV.

In operation S211, the diffusion resistance data calculator 233a may receive the OCV data Data_OCV, the cell voltage data Data_Vcell, and the module current data Data_Imod of the (k−1)-th time point and the OCV data Data_OCV and the module current data Data_Imod of the k-th time point.

In operation S212, the diffusion resistance data calculator 233a may calculate an output voltage predicted value of the k-th time point by substituting the data (hereinafter referred to as "input data") received in operation S211 into Equation 9 through Equation 15.

The diffusion resistance data calculator 233a may perform the least squares algorithm in operation S213 through operation S215.

In operation S213, the diffusion resistance data calculator 233a may receive the cell voltage data Data_Vcell of the k-th time point. Then, the diffusion resistance data calculator 233a may calculate an error by comparing the cell voltage data Data_Vcell of the k-th time point and the output voltage predicted value of the k-th time point.

In operation S214, the diffusion resistance data calculator 233a may calculate a weight by using the error calculated in operation S213. Afterwards, the diffusion resistance data calculator 233a may update the error covariance of the k-th time point based on the weight, the input data, and the error covariance of the (k−1)-th time point.

In operation S215, the diffusion resistance data calculator 233a may update the model parameter of the k-th time point by adding the model parameter of the (k−1)-th time point and a value obtained by multiplying the error of the k-th time point and the weight together. Then, the diffusion resistance data may be calculated based on the model parameter of the k-th time point.

Returning to FIG. 6, the diffusion resistance data calculator 233a may generate and output the diffusion resistance deviation Var_R based on the diffusion resistance data of the battery cells received from the diffusion resistance data calculator 233a.

As an example, the diffusion resistance deviation Var_R may be defined as a ratio between an average value of pieces of diffusion resistance data and the greatest value of the pieces of diffusion resistance data. The diffusion resistance deviation generator 233b may output the diffusion resistance deviation Var_R by using a percentage value.

The diffusion resistance deviation Var_R output from the diffusion resistance deviation generator 233b may be provided to the risk calculator 310 of FIG. 2.

Returning to FIG. 2, the temperature deviation Var_T, the voltage deviation Var_V, and the diffusion resistance deviation Var_R of the battery cells calculated by the deviation calculator 200 may be provided to the risk calculator 310 included in the risk assessment unit 300.

The risk assessment unit 300 included in the battery risk assessment device 10 may include the risk calculator 310 and a risk status indicator 320.

The risk calculator 310 may be configured to receive the deviation information Data_Var from the deviation calculator 200, and to calculate a risk score R_score. An example of the risk calculator 310 is described with reference to FIG. 8.

Figure 8:
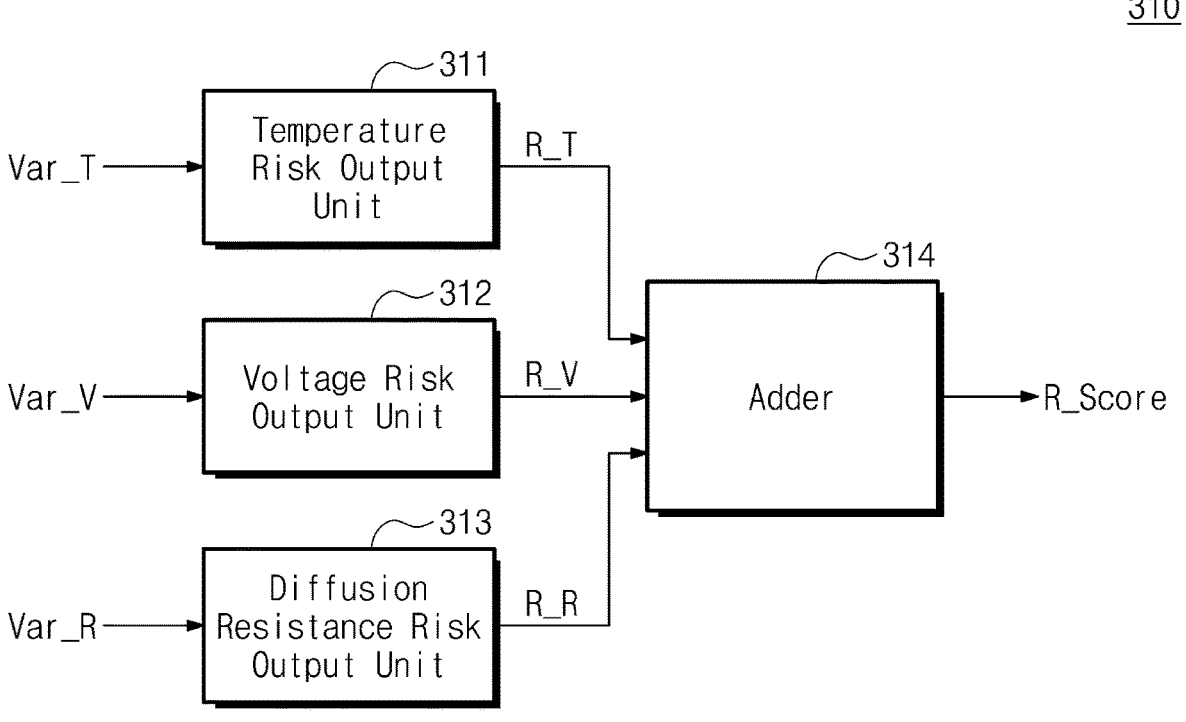
FIG. 8 is a diagram illustrating an example of a risk calculator of FIG. 2, according to an embodiment of the present disclosure

FIG. 8 is a diagram illustrating an embodiment of a risk calculator of FIG. 2. FIG. 9 is a diagram illustrating an example of a risk score table for assigning a risk score to deviation information.

Referring to FIGS. 8 and 9, the risk calculator 310 may include a temperature risk output unit 311, a voltage risk output unit 312, a diffusion resistance risk output unit 313, and an adder 314.

The temperature risk output unit 311 may receive the temperature deviation Var_T. The temperature risk output unit 311 may assign a score depending on the received temperature deviation Var_T, and to output a first risk R_T. For example, the score of the first risk R_T may be "0" when the temperature deviation Var_T ranges from 0 degree to 5 degrees, may be "1" when the temperature deviation Var_T ranges from 5 degrees to 8 degrees, and may be "2" when the temperature deviation Var_T exceeds 8 degrees.

The voltage risk output unit 312 may receive the voltage deviation Var_V. The voltage risk output unit 312 may assign a score depending on the received voltage deviation Var_V, and to output a second risk R_V. For example, the score of the second risk R_V may be "0" when the voltage deviation Var_V ranges 0 V to 0.1 V and may be "1" when the voltage deviation Var_V exceeds 0.1 V.

The diffusion resistance risk output unit 313 may receive the diffusion resistance deviation Var_R. The diffusion resistance risk output unit 313 may assign a score depending on the received diffusion resistance deviation Var_R, and to output a third risk R_R. For example, the score of the third risk R_R may be "0" when the diffusion resistance deviation Var_R ranges from 0% to 142%, may be "1" when the diffusion resistance deviation Var_R ranges from 142% to 165%, may be "2" when the diffusion resistance deviation Var_R ranges from 165% to 273%, and may be "3" when the diffusion resistance deviation Var_R is greater than or equal to 273%.

The criteria for assigning the first to third risks Var_V, Var_T, and Var_R are not limited to the above examples, and scores may be differently determined depending on a use environment of a battery targeted for risk assessment and the user.

The adder 314 may receive the first to third risks Var_V, Var_T, and Var_R. The adder 314 may add the first to third risks Var_V, Var_T, and Var_R and may output the risk score R_score to the risk status indicator 320 of FIG. 2.

The risk status indicator 320 may determine the battery risk state based on the risk score R_score thus received.

When the risk score R_score is less than or equal to a first reference value, the risk status indicator 320 may determine the battery to be in the normal state. For example, when the risk score R_score is less than or equal to "2", the risk status indicator 320 may determine the battery to be in the normal state.

When the risk score R_score exceeds the first reference value and is less than or equal to a second reference value, the risk status indicator 320 may determine the battery to be in the management-targeted state. For example, when the risk score R_score exceeds "2" and is less than "4", the risk status indicator 320 may determine the battery to be in the management-targeted state.

When the risk score R_score exceeds the second reference value and is less than or equal to a third reference value, the risk status indicator 320 may determine the battery to be in the check-required state. For example, when the risk score R_score exceeds "4" and is less than "6", the risk status indicator 320 may determine the battery to be in the check-required state.

When the risk score R_score exceeds the third reference value, the risk status indicator 320 may determine the battery to be in the immediate stop state. For example, when the risk score R_score exceeds "6", the risk status indicator 320 may determine the battery to be in the immediate stop state.

Figure 10:
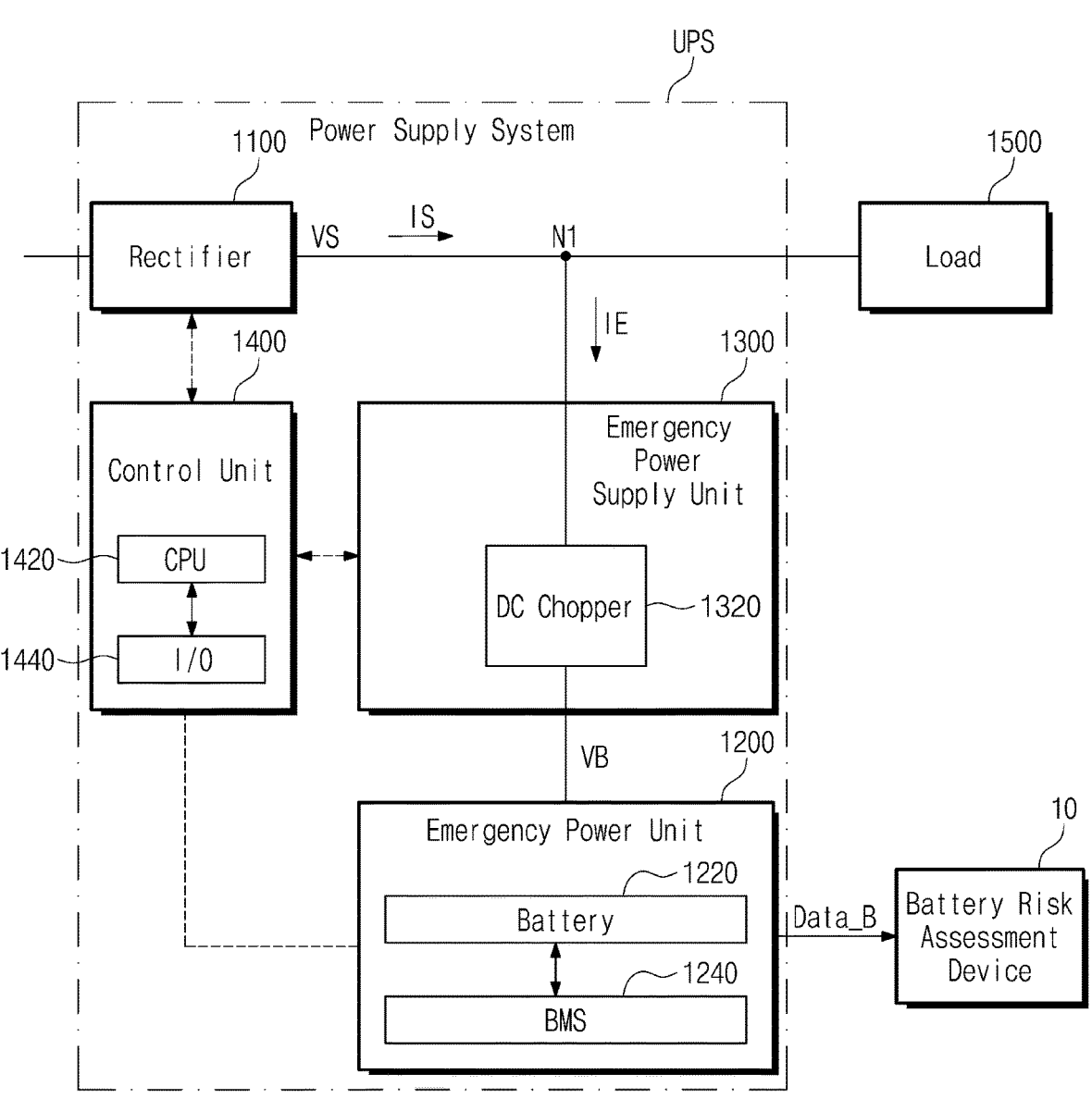
FIG. 10 is a block diagram illustrating an example in which a battery risk assessment device is applied to an uninterruptible power supply system, according to an embodiment of the present disclosure.

FIG. 10 is a block diagram illustrating an example in which a battery risk assessment device is applied to an uninterruptible power supply system, according to embodiments of the present disclosure.

Referring to FIG. 10, a battery risk assessment device according to embodiments of the present disclosure may be configured to assess a risk of a battery included in an uninterruptible power supply system UPS.

The uninterruptible power supply system UPS may include a first rectifier 1100, a first emergency power unit 1200, a first emergency power supply unit 1300, a control unit 1400.

The first rectifier 1100 may include an insulated gate bipolar mode transistor (IGBT) rectifier, however embodiments are not limited thereto. The first rectifier 1100 may convert an AC power to a first DC power.

The first emergency power unit 1200 may be implemented with an emergency power supply source that supplies an emergency power to a load 1500 in the station blackout. The first emergency power unit 1200 may include a first battery 1220 and a first battery management system (BMS) 1240.

The first emergency power supply unit 1300 may form a path through which an emergency power is supplied from the first emergency power unit 1200 to the load 1500 in the blackout state. For example, the blackout state may refer a state where the first rectifier 1100 does not output the first DC power. The first emergency power supply unit 1300 may include a first DC chopper 1320.

A first connection node N1 may refer a point where an output terminal of the first rectifier 1100 and a first terminal of the first emergency power supply unit 1300 are connected. A second connection node that is different from the first connection node N1 may refer to a point where a second terminal of the first emergency power supply unit 1300 and the first emergency power unit 1200 are connected. Voltages of the first connection node N1 and the second connection node N2 may be identical at a specific time point; however, the first connection node N1 and the second connection node N2 are different nodes that are physically separated from each other.

The control unit 1400 may control the first rectifier 1100, the first emergency power unit 1200, and the first emergency power supply unit 1300. The control unit 1400 may include a CPU 1420 and an input/output (I/O) terminal 1440.

In a normal state, the control unit 1400 may turn on the first DC chopper 1320. In this case, the first DC chopper 1320 may step up a voltage VS of a first DC power source such that the first battery 1220 is charged to a battery voltage VB in the floating charge manner. For example, the normal state may refer to a state where the first rectifier 1100 outputs the first DC power.

When the first DC chopper 1320 operates abnormally in the normal state, the control unit 1400 may turn off the first DC chopper 1320.

In the blackout state, the control unit 1400 may turned off the first rectifier 1100 and may maintain the turn-on state of the first DC chopper 1320. In this case, the first DC chopper 1320 may form a path through which a second DC power is supplied to the first connection node N1. For example, the second DC power may refer to a power that is supplied from the first battery 1220 to the load 1500 through the first DC chopper 1320. The first battery 1220 may supply the second DC power by stepping down, at the first DC chopper 1320, the battery voltage VB of the first battery 1220 so as to be applied to the first connection node N1.

When the first DC chopper 1320 operates abnormally in the blackout state, the control unit 1400 may turn off the first rectifier 1100 and the first DC chopper 1320.

In an application example, the battery risk assessment device 10 according to the present disclosure may be configured to collect the battery information Data_B from the first BMS 1240 included in the uninterruptible power supply system, and to calculate the risk of the first battery 1220.

In an application example, cell voltage data, cell temperature data, and diffusion resistance data associated with the first battery 1220 may be stored in the first BMS 1240 included in the uninterruptible power supply system. In this case, the battery risk assessment device 10 according to the present disclosure may assess the risk by calculating a voltage deviation, a temperature deviation, and a diffusion resistance deviation associated with each battery cell by using the cell voltage data, the cell temperature data, and the diffusion resistance data stored in the first BMS 1240 included in the uninterruptible power supply system.

According to an embodiment of the present disclosure, a device capable of assessing a battery risk by monitoring a battery in real time may be provided.

According to an embodiment of the present disclosure, a method capable of assessing a battery risk by monitoring a battery in real time may be provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A battery risk assessment device for a battery module including a plurality of battery cells, the battery risk assessment device comprising:

a data measurement unit configured to generate sensing data corresponding to the battery module, wherein the sensing data include cell voltage data comprising voltage information about the plurality of battery cells, cell temperature data comprising temperature information about the plurality of battery cells, module voltage data comprising information about a voltage output from the battery module, and module current data comprising information about a current output from the battery module;

a deviation calculator configured to:

calculate diffusion resistance data of the plurality of battery cells by using a Thevenin equivalent circuit of the battery module, and calculate deviation information based on the sensing data and the diffusion resistance data, wherein the deviation information indicates at least one from among a voltage deviation of the plurality of battery cells, a temperature deviation of the plurality of battery cells, and a diffusion resistance deviation of the plurality of battery cells, wherein the deviation calculator comprises a diffusion resistance deviation calculator configured to calculate the diffusion resistance deviation based on a ratio between an average value of the diffusion resistance data and a greatest value of the diffusion resistance data; and a risk assessment unit configured to:

determine a battery risk state based on the deviation information, and control an operation of a terminal including the battery module based on the battery risk state.

2. The battery risk assessment device of claim 1, wherein the deviation calculator further comprises:

a temperature deviation calculator configured to calculate the temperature deviation based on a difference between a maximum temperature of the cell temperature data and a minimum temperature of the cell temperature data; and

a voltage deviation calculator configured to calculate the voltage deviation based on a difference between a maximum voltage of the cell voltage data and a minimum voltage of the cell voltage data.

3. The battery risk assessment device of claim 2, wherein the diffusion resistance deviation calculator comprises:

a state-of-charge (SOC) estimator configured to generate SOC data by calculating a battery SOC based on the Thevenin equivalent circuit using an extended Kalman filter;

an open circuit voltage (OCV) estimator configured to output OCV data based on the SOC data by using an SOC-OCV table; and a diffusion resistance calculator configured to calculate the diffusion resistance data based on the OCV data and the sensing data, and generate the diffusion resistance deviation based on the diffusion resistance data.

4. The battery risk assessment device of claim 3, wherein the diffusion resistance calculator comprises:

a diffusion resistance data calculator configured to calculate the diffusion resistance data based on the Thevenin equivalent circuit using a recursive least squares algorithm; and a diffusion resistance deviation generator configured to calculate the diffusion resistance deviation based on the diffusion resistance data.

5. The battery risk assessment device of claim 4, wherein the diffusion resistance data calculator is further configured to calculate the diffusion resistance data using the cell voltage data at a first time point and a second time point, the module current data at the first time point and the second time point, and the OCV data at the first time point and the second time point.

6. The battery risk assessment device of claim 2, wherein the risk assessment unit comprises:

a risk calculator configured to generate a risk score based on the deviation information; and a risk status indicator configured to determine the battery risk state based on the risk score.

7. The battery risk assessment device of claim 6, wherein the risk calculator comprises:

a temperature risk output unit configured to generate a first risk score based on the temperature deviation;

a voltage risk output unit configured to generate a second risk score based on the voltage deviation;

a diffusion resistance risk output unit configured to generate a third risk score based on the diffusion resistance deviation; and an adder configured to generate the risk score by adding the first risk score, the second risk score, and the third risk score.

8. The battery risk assessment device of claim 7, wherein the risk status indicator is further configured to:

based on the risk score being less than or equal to a first reference value, determine the battery module to be in a normal state;

based on the risk score exceeding the first reference value and being less than or equal to a second reference value, determine the battery module to be in a management-targeted state;

based on the risk score exceeding the second reference value and being less than or equal to a third reference value, determine the battery module to be in a check-required state; and based on the risk score exceeding the third reference value, determine the battery module to be in an immediate stop state.

9. A battery risk assessment method for a battery module including a plurality of battery cells, the method comprising:

generating sensing data corresponding to the battery module, wherein the sensing data include cell voltage data comprising voltage information about the plurality of battery cells, cell temperature data comprising temperature information about the plurality of battery cells, module voltage data comprising information about a voltage output from the battery module, and module current data comprising information about a current output from the battery module;

calculating diffusion resistance data of the plurality of battery cells by using a Thevenin equivalent circuit of the battery module;

calculating deviation information based on the sensing data and the diffusion resistance data, wherein the deviation information indicates at least one from among a voltage deviation of the plurality of battery cells, a temperature deviation of the plurality of battery cells, and a diffusion resistance deviation of the plurality of battery cells, wherein the diffusion resistance deviation is calculated based on a ratio between an average value of the diffusion resistance data and a greatest value of the diffusion resistance data;

determining a battery risk state based on the deviation information; and controlling an operation of a terminal including the battery module based on the battery risk state.

10. The method of claim 9, wherein the temperature deviation is calculated based on a difference between a maximum temperature of the cell temperature data and a minimum temperature of the cell temperature data, and wherein the voltage deviation is calculated based on a difference between a maximum voltage of the cell voltage data and a minimum voltage of the cell voltage data.

11. The method of claim 10, wherein the calculating of the diffusion resistance data comprises:

generating state-of-charge (SOC) data by calculating a battery SOC based on the Thevenin equivalent circuit using an extended Kalman filter; and calculating the diffusion resistance data based on the SOC data and the sensing data.

12. The method of claim 11, wherein the calculating of the diffusion resistance data based on the SOC data and the sensing data comprises calculating the diffusion resistance data based on the Thevenin equivalent circuit by using a recursive least squares algorithm.

13. The method of claim 11, wherein the calculating of the diffusion resistance data based on the SOC data and the sensing data comprises calculating the diffusion resistance data using the cell voltage data at a first time point and a second time point, the module current data at the first time point and the second time point, and open circuit voltage data at the first time point and the second time point.

14. The method of claim 9, wherein the determining of the battery risk state comprises:

generating a risk score based on the deviation information; and determining the battery risk state based on the risk score.

15. The method of claim 14, wherein the generating of the risk score comprises:

generating a first risk score based on the temperature deviation;

generating a second risk score based on the voltage deviation;

generating a third risk score based on the diffusion resistance deviation; and adding the first risk score, the second risk score, and the third risk score to generate the risk score.

16. The method of claim 15, wherein the determining of the battery risk state includes:

based on the risk score being less than or equal to a first reference value, determining the battery module to be in a normal state;

based on the risk score exceeding the first reference value and being less than or equal to a second reference value, determining the battery module to be in a management-targeted state;

based on the risk score exceeding the second reference value and being less than or equal to a third reference value, determining the battery module to be in a check-required state; and based on the risk score exceeding the third reference value, determining the battery module to be in an immediate stop state.

17. A terminal comprising:

a battery risk assessment device corresponding to a battery module including a plurality of battery cells, wherein the battery risk assessment device comprises:

a data measurement unit configured to measure the battery module at regular time intervals and to generate sensing data, wherein the sensing data include cell voltage data comprising voltage information about the plurality of battery cells, cell temperature data comprising temperature information about the plurality of battery cells, module voltage data comprising information about a voltage output from the battery module, and module current data comprising information about a current output from the battery module;

a deviation calculator configured to:

calculate diffusion resistance data of the plurality of battery cells by using a Thevenin equivalent circuit of the battery module, and calculate deviation information based on the sensing data and the diffusion resistance data, wherein the deviation information indicates at least one from among a voltage deviation of the plurality of battery cells, a temperature deviation of the plurality of battery cells, and a diffusion resistance deviation of the plurality of battery cells, wherein the diffusion resistance deviation is calculated by a diffusion resistance deviation calculator based on a ratio between an average value of the diffusion resistance data and a greatest value of the diffusion resistance data; and a risk assessment unit configured to determine a battery risk state based on the deviation information; and a battery management unit configured to control an operation of the terminal based on the battery risk state.

18. The terminal of claim 17, wherein the deviation calculator comprises:

a temperature deviation calculator configured to calculate the temperature deviation based on a difference between a maximum temperature of the cell temperature data and a minimum temperature of the cell temperature data; and a voltage deviation calculator configured to calculate the voltage deviation based on a difference between a maximum voltage of the cell voltage data and a minimum voltage of the cell voltage data.

19. The terminal of claim 17, wherein the diffusion resistance deviation calculator comprises:

a state-of-charge (SOC) estimator configured to generate SOC data by calculating a battery SOC based on the Thevenin equivalent circuit using an extended Kalman filter;

an open circuit voltage (OCV) estimator configured to output OCV data based on the SOC data by using an SOC-OCV table; and a diffusion resistance calculator configured to calculate the diffusion resistance data based on the OCV data and the sensing data, and generate the diffusion resistance deviation based on the diffusion resistance data.

20. The terminal of claim 19, wherein the diffusion resistance calculator comprises:

a diffusion resistance data calculator configured to calculate the diffusion resistance data based on the Thevenin equivalent circuit using a recursive least squares algorithm; and a diffusion resistance deviation generator configured to calculate the diffusion resistance deviation based on the diffusion resistance data.

* * * * *